United States Patent
Thebault et al.

(12) 
(10) Patent No.: US 6,616,756 B2
(45) Date of Patent: Sep. 9, 2003

(54) PROTECTION FOR A CARBON MATERIAL, IN PARTICULAR C/C COMPOSITE, BOWL THAT IS TO RECEIVE A CRUCIBLE, SUCH AS A SILICA CRUCIBLE FOR DRAWING SILICON

(75) Inventors: Jacques Thebault, Bordeaux (FR); Jean Michel Georges, Blanquefort (FR); Dominique Coupe, Le Haillan (FR)

(73) Assignee: Snecma Moteurs, Paris (FR)

( * ) Notice: Subject to any disclaimer, the term of this patent is extended or adjusted under 35 U.S.C. 154(b) by 0 days.

(21) Appl. No.: 10/035,019

(22) Filed: Dec. 26, 2001

(65) Prior Publication Data

US 2002/0088390 A1 Jul. 11, 2002

(30) Foreign Application Priority Data

Dec. 27, 2000 (FR) .............................. 00 17098

(51) Int. Cl.$^7$ .............................................. C30B 15/20
(52) U.S. Cl. .................... 117/13; 117/213; 313/341; 423/447.1; 423/447.2
(58) Field of Search .................. 117/13, 213; 313/341; 423/447.1, 447.2

(56) References Cited

FOREIGN PATENT DOCUMENTS

| DE | 40 07 053 A1 | 9/1990 |
|---|---|---|
| JP | 1-005975 | 1/1989 |
| JP | 9-263482 | 10/1997 |
| JP | 10-025185 | 1/1998 |
| JP | 10-158089 | 6/1998 |
| WO | 98-44182 | 10/1998 |
| WO | 98-48085 | 10/1998 |

*Primary Examiner*—Felisa Hiteshew
(74) *Attorney, Agent, or Firm*—Weingarten, Schurgin, Gagnebin & Lebovici LLP

(57) ABSTRACT

Prior to housing the crucible in the bowl, a consumable buffer ply is applied over at least a portion of the inside face of the bowl, the ply being constituted essentially by a non-rigid carbon fiber fabric for protecting the bowl from both physical and chemical interactions with the crucible. The buffer ply is essentially constituted by a flexible fabric selected from: a woven cloth, a knit, a multidirectional sheet, and a thin felt. Prior to putting the ply into place in the bowl, it is possible to form a thin deposit of pyrolytic carbon on the fibers of the fabric.

21 Claims, 2 Drawing Sheets

PROTECTION FOR A CARBON MATERIAL, IN PARTICULAR C/C COMPOSITE, BOWL THAT IS TO RECEIVE A CRUCIBLE, SUCH AS A SILICA CRUCIBLE FOR DRAWING SILICON

BACKGROUND OF THE INVENTION

The invention relates to bowls of carbon material, in particular of carbon/carbon (C/C) composite material, used for receiving a crucible in a metallurgical installation.

A particular field of application of the invention is that of bowls for receiving crucibles for drawing silicon single crystals.

A well-known process of producing a silicon single crystal, in particular for the purpose of fabricating semiconductors, consists in melting silicon in a receptacle, in putting the bath of liquid silicon into contact with a seed crystal having the desired crystal configuration, thereby initiating solidification of the silicon with this crystal configuration, and in mechanically drawing the resulting single crystal out from the crucible. That process is known as the Czochralski process or the "Cz" process.

The receptacle containing the molten silicon is frequently a crucible made of silica or of quartz ($SiO_2$) placed in a bowl, which bowl is sometimes referred to as a "susceptor". Heating can be provided by radiation from a cylindrical graphite body, e.g. a body heated by the Joule effect and surrounding the bowl.

Traditionally, the bowls used in Cz processes have been made of graphite. The graphite pieces used as bowls are fragile. They are often built up using a plurality of parts and therefore cannot retain molten silicon in the event of the crucible breaking or leaking. This safety problem becomes critical when the size of the silicon crystals drawn becomes large, since there is a corresponding increase in the mass of liquid silicon. Furthermore, graphite bowls generally have a lifetime that is short and thickness that is large, and are thus massive and bulky.

In order to avoid those drawbacks, proposals have been made to make bowls out of C/C composite material comprising carbon fiber reinforcement densified with a carbon matrix. Such a material has much better mechanical strength than graphite and makes it possible to envisage producing bowls of large diameter, for example of diameter reaching or even exceeding 850 millimeters (mm) so as to be able to satisfy the demand for silicon single crystals of large section. In addition, the wall thickness of such bowls can be reduced compared with the wall thickness of graphite bowls, thereby facilitating the transmission of heat flux to the crucible and reducing mass and bulk.

The fabrication of pieces made out of C/C composite material is relatively expensive, particularly when such pieces are of a shape that cannot be developed and that is hollow, as applies to bowls. It is important to ensure that bowls have a service life that is as long as possible and therefore to protect the bowls against corrosion caused by chemical reaction between the material constituting the crucible and the carbon of the bowl.

With crucibles made of silica, the problem of corrosion is known. It involves SiO being given off and silicon carbide (SiC) being formed which, in turn, can react with the silica of the crucible, thereby giving rise to progressive consumption of the C/C composite and a decrease in the wall thickness of the bowl which puts a limit on its service lifetime.

To resolve this problem, proposals have been made to make C/C composite material bowls that are double-walled: an outer wall of C/C composite material having high mechanical strength and an inner wall which is at least partially of C/C composite material and which constitutes a replaceable, consumable lining. Such a solution, as described in particular in Japanese patent applications published under the numbers JP 9-263 482 and JP 10-25 185, is not satisfactory from the cost point of view. Making an inner wall or at least a portion of an inner wall out of C/C material remains lengthy and expensive, even when lower mechanical strength is required.

It should be observed that placing a graphite or a C/C composite material protective structure between the crucible and the bowl is also known for graphite bowls built up from a plurality of sections, as described in documents JP 10-158089 and DE 40 07 053.

Proposals have also been made, in particular in the Japanese patent application published under the No. JP 10-059795, to provide the inside surface of a C/C composite bowl with a coating of high purity pyrolytic carbon. The coating is made by chemical vapor deposition (CVD) which adds a relatively lengthy and expensive operation to the process of fabricating the bowl. In addition, such a coating is not exempt from being chemically corroded by the material of the crucible and in the long run will expose the C/C composite material to corrosion and possibly require a new operation of chemical vapor deposition to be performed.

There therefore exists a need to solve the problem of protecting the C/C composite material of the bowl against being chemically corroded by the material of the crucible, in a manner that is simple and inexpensive.

The Applicant has also found another problem associated with the interaction between the crucible and the bowl being not only chemical, but also physical.

In operation, the silica crucible softens and fits closely to the inside face of the bowl containing it. On cooling, a heat-shrink effect occurs where the bowl tightens against the crucible because of differences in the way the dimensions of the crucible and the bowl materials vary. This causes stresses to be applied to the bowl.

With graphite bowls, this problem of stresses is solved by the bowls being made up of a plurality of segments. However, with C/C composite bowls, these stresses can limit lifetime or can give rise to residual deformation.

In addition, heat shrinking of the bowl onto the crucible makes it difficult to remove the crucible at the end of each crystal-drawing cycle.

Furthermore, the effects of the chemical and physical phenomena amplify each other mutually.

OBJECTS AND SUMMARY OF THE INVENTION

An object of the invention is to propose a solution to the above-specified problems that is simple and of low cost, making it possible to reduce considerably the extent to which the crucible material corrodes bowls made of carbon material, in particular C/C composite material, and making it possible to limit the mechanical stresses that are generated in bowls, thereby lengthening the service lifetime of bowls.

This object is achieved by a method of mounting a crucible in a carbon material bowl in which method, prior to housing the crucible in the bowl, a consumable buffer ply is applied over at least a portion of the inside face of the bowl, the consumable ply being constituted essentially by a non-rigid carbon fiber fabric.

By way of example, a non-rigid carbon fiber fabric is a woven cloth, a knit, a multidirectional sheet, or a thin felt, with such a fabric having flexibility that enables it to adapt to the shape of at least a concave portion of the inside face of the bowl. Such a fabric also has macropores and offers limited contact area with the solid surface against which it is applied.

The invention is remarkable in that in spite of its small thickness and its porosity, such a buffer ply provides protection which is effective, as described in greater detail below. In addition, such a ply, even though it needs to be replaced periodically, and as a result constitutes a consumable, nevertheless provides protection at relatively low cost.

In addition, such a buffer ply, because it has the ability to deform in its thickness and because it is not bonded to the material of the bowl, limits the extent to which stresses are generated in the bowl as a result of differential variations in dimensions between the bowl and the crucible, and makes it easier to withdraw the crucible at the end of a crystal-drawing cycle.

The buffer ply can be made of a deformable fabric capable of fitting to the shape of at least a portion of the inside face of the bowl merely by deformation within the fabric, and without forming creases.

It is also possible to use a buffer ply made of a fabric that is precut so as to enable it to fit closely to the shape of at least a portion of the inside face of the bowl.

According to a feature of the method, prior to putting the buffer ply into place in the bowl, a thin coating of pyrolytic carbon can be formed on the fibers of the ply. Such a thin coating can be formed so as to "fix" the fibers and prevent them from becoming separated while the bowl is in use. The thin coating of pyrolytic carbon could also be made on the buffer ply while it is held in a desired shape, so as to "preform" the buffer ply into a shape that is at least close to the desired shape, while not causing the ply to become rigid.

In practice, the thickness of the coating of pyrolytic carbon on the fibers should not exceed 4 microns ($\mu$m), and is preferably no greater than 2 $\mu$m. The thin coating of pyrolytic carbon can also avoid impurities diffusing from the fibers to the crucible.

According to yet another feature of the method, purification heat treatment is performed on the buffer ply.

The invention also seeks to provide a metallurgical installation, in particular for drawing silicon single crystals, the installation comprising a support bowl of C/C composite material, a crucible received in the bowl, and bowl protection means interposed between the bowl and the crucible, in which installation the protection means comprise a buffer ply as defined above.

BRIEF DESCRIPTION OF THE DRAWINGS

The invention will be better understood on reading the following description given by way of non-limiting indication and with reference to the accompanying drawings, in which.

DETAILED DESCRIPTION OF EMBODIMENTS OF THE INVENTION

The description below relates to applying the invention to an installation for drawing silicon single crystals, and more particularly silicon single crystals as obtained by the "Cz" process. Nevertheless, the invention is equally applicable to any bowl of carbon material used for supporting a crucible, particularly in metallurgical installations, and more particularly whenever the bowl needs to be protected from physical and chemical interaction with the crucible.

In addition, although the description below relates to protecting C/C composite bowls, the invention is applicable more generally to bowls of carbon material, i.e. bowls made of a material constituted at least in part by carbon. The term "carbon material" is used in particular to cover solid carbon materials and composite materials in which the fiber reinforcement and/or the matrix contains carbon, for example composite materials having carbon fiber reinforcement or reinforcement made of other fibers optionally coated in carbon and having a matrix that is made of ceramic or a matrix that is a combination of carbon and ceramic.

Figure 1:
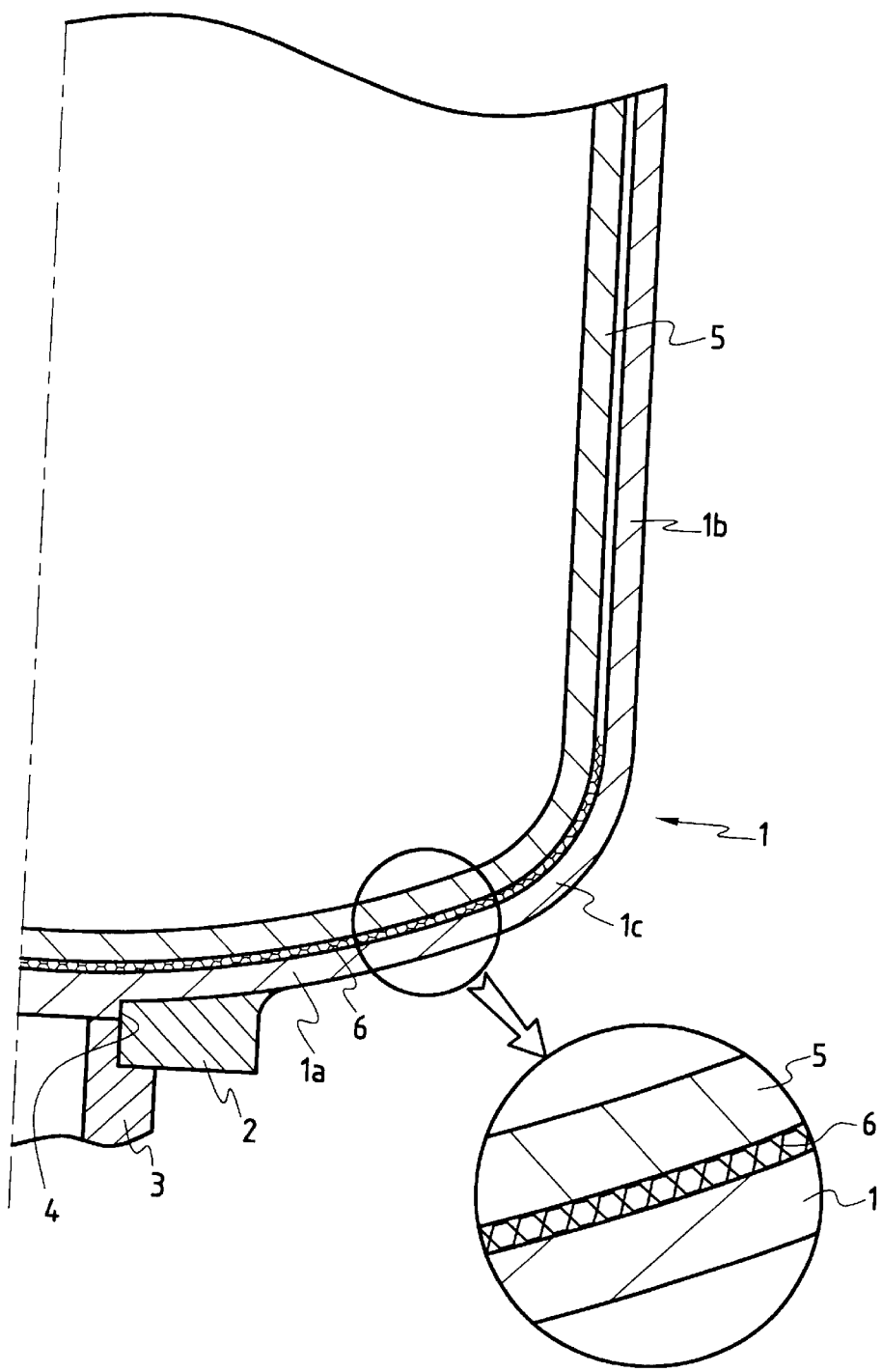
FIG. 1 is a highly diagrammatic half view in section showing a bowl of composite material provided with a buffer ply and used as a crucible support in an installation for producing silicon single crystal, in an embodiment of the invention.

FIG. 1 shows a C/C composite bowl supporting a silica crucible 5 for receiving a bath of silicon. The bowl 1 stands on an annular support constituted by a ring 2 mounted at the end of a shaft 3 and co-operating therewith to form a setback 4. The bowl has a bottom portion 1a and a surrounding portion 1b that is substantially cylindrical, connecting with the bottom portion 1a via a connection portion 1c of rounded profile. The bottom 1a of the bowl is machined to form a centering stud that matches the setback 4 and a bearing surface on the ring 2.

The C/C composite bowl is fabricated by making a preform of reinforcing fiber having a shape that correspond to that of the bowl, and then in densifying the preform with a carbon matrix.

The fiber preform can be made by winding a filament. It is then possible to leave a central opening in the bottom of the preform so as to avoid making winding excessively complicated, and the opening can subsequently be closed by a bottom piece which is fitted at a later stage in the fabrication of the bowl.

The fiber preform can also be made by draping two-dimensional plies onto a shaper with the plies being bonded to one another by needling, for example. It is possible to use plies in which cutouts or "darts" have been made so that they can fit the desired shape with the lips of the cutouts or darts coming together once they have been draped; It is also possible to use plies that are made of a deformable fabric that is capable of taking up the desired shape without forming creases.

The fiber preform can be consolidated using a liquid. For this purpose, the preform can be made by winding preimpregnated yarns or by draping preimpregnated plies, where preimpregnation is performed using a carbon-precursor resin, e.g. a phenolic resin. After the resin has been polymerized and carbonized, the carbon residue of the resin bonds the fibers of the preform together sufficiently to allow the preform to be handled without losing its cohesion.

It should be observed that the preform can be made by winding dry yarn or by draping dry plies, with resin impregnation then being performed in a mold containing the preform.

The preform can optionally be consolidated and densified with a pyrolytic carbon matrix by using a liquid technique: impregnation using a carbon-precursor resin and then heat treatment for polymerization and carbonization purposes; or else by using a gas technique: chemical vapor infiltration.

Chemical vapor infiltration can be performed for densification purposes in conventional manner by placing the consolidated preform in an enclosure into which there is introduced a gas containing a carbon precursor, e.g. containing methane. The pressure and temperature conditions are selected so as to enable the gas to diffuse within the pores of the consolidated preform, and decomposition of the precursor gives rise to pyrolytic carbon being deposited on the fibers.

After densification, the resulting bowl is machined and can be subjected to conventional final heat treatment at high temperature (greater than 2000° C.) in an atmosphere that is inert or reactive (e.g. containing a halogen) for purification purposes.

Methods of fabricating bowls of C/C composite material are well known. In addition to the documents mentioned above, reference can also be made to international patent applications PCT/FR00/03275 and PCT/FR00/03276.

In accordance with the invention, a buffer ply 6 essentially constituted by a thin, non-rigid fabric of carbon fibers is interposed between the bowl 1 and the crucible 5.

In the example shown, the ply 6 is applied against a portion of the inside surface of the bowl situated facing the crucible 5, specifically the inside faces of the bottom 1a and of the connection portion 1c. Although the ply can be applied against the entire inside face of the bowl, the presence of the ply 6 is advantageously restricted to those zones of the inside surface of the bowl that are the most exposed to physical and chemical interactions with the crucible 5, specifically at least the bottom portion 1a or the bottom portion 1a together with at least an adjacent zone of the connection portion 1c.

The fabric of the ply 6 is a flexible fabric such as a woven cloth, a knit, a multidirectional sheet, or a thin felt of carbon fibers. Preferably, the thickness of the fabric does not exceed 4 mm.

Figure 2:
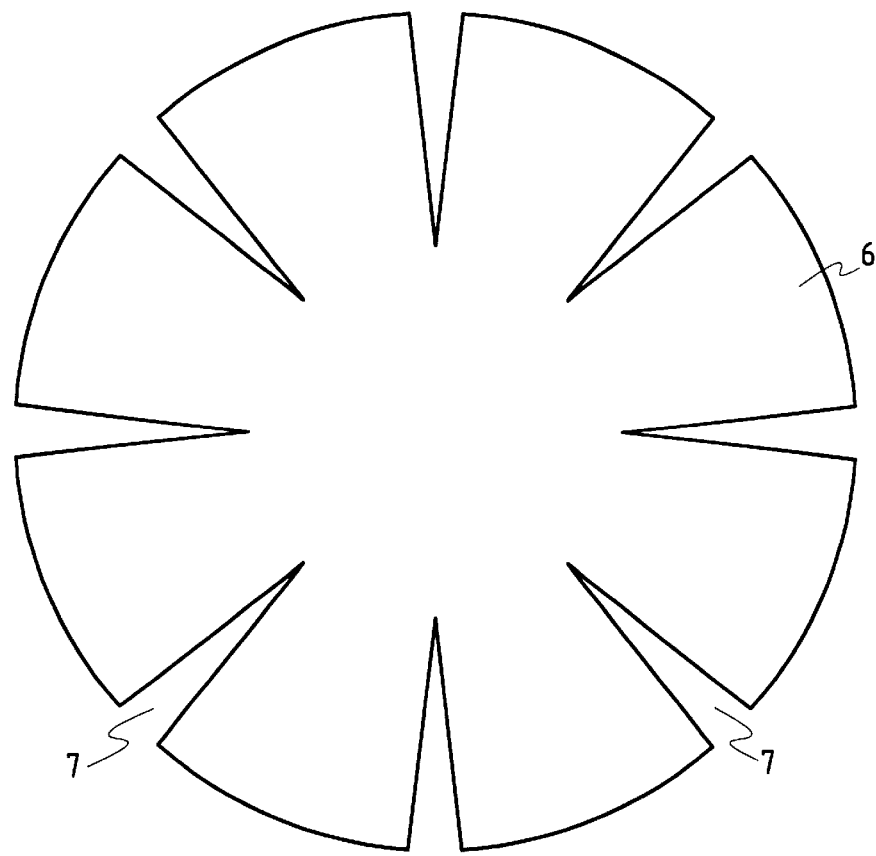
FIG. 2 is highly diagrammatic and shows part of an example of two-dimensional fiber fabric precut so as to form a buffer ply.

For a flexible fabric that does not have the ability to deform sufficiently to fit closely to the shape of the concave inside face of the bowl without creasing, it is possible to make darts or cutouts 7 in the ply 6, e.g. as shown in FIG. 2. The darts 7 flare outwards from a solid central zone corresponding substantially to the center of the bottom of the bowl. The darts 7 are made in such a manner that when the buffer ply is put into place in the bowl, the lips of the darts move towards each other and meet without creating overlap regions of extra thickness.

In a variant, a flexible and deformable fabric is used that is capable of matching the concave shape of the inside face of the bowl merely by deforming, without forming creases and without needing any cutouts or darts to be formed. Such a deformable fabric can be constituted by a thin felt or by a plurality of unidirectional sheets of carbon yarns which are superposed in different directions and bonded together so as to form individual mesh loops that are deformable.

The sheets can be bonded together by light needling, thus ensuring that the fabric is cohesive while still leaving it with sufficient capacity to deform. The sheets are preferably bonded together by stitching or by knitting using a carbon thread passing from one face to the other of the fabric.

Application WO 98/44182 describes deformable fabrics which are made from two superposed unidirectional sheets extending in directions that are at an angle to each other lying in the range 45° to 90°, and preferably in the range 45° to 60°, and that are bonded together by a knitted thread.

Prior to installing a buffer ply in a bowl that is to be protected, the ply can be predeformed on tooling having a convex surface corresponding to the concave shape of the inside surface of the bowl against which the fabric is to be fitted.

Figure 3:
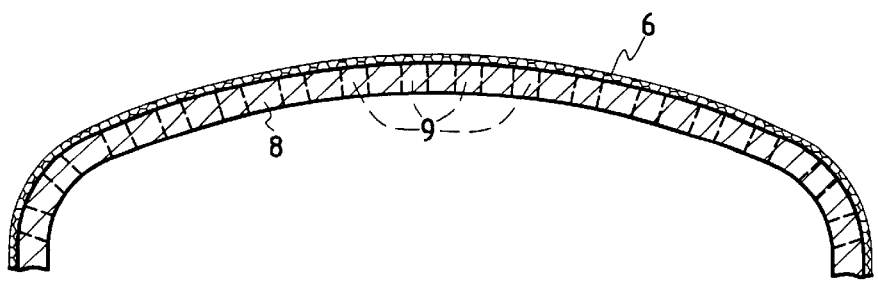
FIG. 3 is a highly diagrammatic view of tooling for shaping a buffer ply in a particular implementation of the invention.

Such tooling 8 is shown in FIG. 3. A ply 6 of deformable fabric is applied onto the tooling 8 and is deformed thereby, e.g. by hand, prior to being transferred into a bowl.

Tooling of the type shown in FIG. 3 can also be used for preshaping a ply so that it has the desired shape or a shape close thereto, while ensuring that the ply continues to be non-rigid, by depositing a thin coating of pyrolytic carbon that coats the fibers of the fabric, and this can be done regardless of the kind of fabric used to make the ply.

For this purpose, the fabric can be lightly preimpregnated prior to being put into place on the tooling, or it can be impregnated after it has been put into place, using a carbon-precursor resin such as a phenolic resin. The fabric is held in shape on the tooling during polymerization and carbonization of the resin.

In a variant, the fabric is put into place on the tooling while in a dry state, and while it is held in shape, e.g. by means of backing tooling, it is subjected to a chemical vapor deposition operation in order to deposit pyrolytic carbon on the fibers from a gas containing a gaseous precursor of carbon, e.g. methane. The tooling and any backing tooling are then preferably made of graphite with passages such as the passages 9 shown in dashed lines in FIG. 3 to give the gas access to the ply 6.

The pyrolytic carbon coating optionally formed on the fibers of the ply 6 by a liquid method or by chemical vapor deposition is of limited thickness, being just sufficient to "pre-form" the ply 6 while retaining its flexible nature. The thickness of the deposit can lie in the range 0.1 $\mu$m to 4 $\mu$m, and preferably lies in the range 0.1 $\mu$m to 2 $\mu$m.

It should be observed that forming such a coating of pyrolytic carbon also serves to retain the carbon fibers of the ply so as to prevent the fibers from becoming detached from the ply, thereby polluting the surroundings, and to prevent impurities diffusing from the fibers to the crucible.

It should also be observed that the same thin deposit of pyrolytic carbon performed by a liquid method or by chemical vapor infiltration can be formed on the fibers of the fabric before any forming on tooling or before direct insertion into the bowl, with the fabric conserving sufficient flexibility to be capable of taking up the desired shape.

Furthermore, prior to being put into place in the bowl, the buffer ply can be subjected to purification treatment by being raised to a temperature higher than 2000° C., e.g. lying in the range 2200° C. to 2700° C. under an inert atmosphere or a halogen atmosphere.

In spite of its small thickness and its porosity, the buffer ply used in accordance with the invention is effective in protecting the bowl from physical and chemical interactions with the crucible. It acts not only as a ply providing insulation between the bowl and the crucible and as a protection layer that can be consumed instead of consuming the bowl, but also:

- it limits contact area with the bowl to a few fibers of carbon, given its open texture, and it therefore limits the amount of SiO gas that is generated by reaction between $SiO_2$ and C;

it provides a large reaction area (the surface area of the fibers in the fabric) for any SiO gas that is produced such that by diffusing through the pores of the ply this gas reacts with the carbon of the fibers and this carbon is consumed practically totally before the bowl starts being consumed; and it is not bonded to the bowl and by means of its flexibility, its low friction, and its ability to deform in thickness, it enables the crucible and the bowl to move relative to each other, possibly with sliding, thus firstly making it possible to absorb differential variations in dimensions, thereby greatly reducing the mechanical stresses induced on the bowl by such variations, and secondly making it possible to withdraw the crucible relatively easily after a crystal-drawing cycle.

EXAMPLE 1

A fiber fabric was made by knitting a commercially available 6K carbon yarn, i.e. a yarn made up of 6000 carbon filaments;

A lose interlock structure knit was used with the weight per unit area of the knit being about 300 grams per square meter ($g/m^2$), and with the thickness of the knit being approximately equal to 1.5 mm.

The fabric was cut out to provide a disk having a diameter of 700 mm and carbon thread edging was used to prevent the fabric from fraying.

The resulting ply was placed on the bottom of a C/C composite bowl having a diameter of 22 inches (about 460 mm) so as to line the bottom of the bowl and the adjacent zone of the connecting portion prior to putting a silicon-containing crucible into place.

After a silicon crystal-drawing cycle, the crucible and the buffer ply were removed from the bowl, sometimes in pieces, and discarded. Because the buffer ply had been used, the bottom of the bowl presented very few traces of chemical attack (consumption of the bowl wall) or traces of mechanical stress (such as residual deformations or cracking). The bowl could be reused after a new buffer ply had been put into place.

The use of a buffer ply of the invention thus provides effective protection at relatively low cost.

EXAMPLE 2

A fiber fabric was made by weaving (plain weave) commercially available 1K carbon yarns. The resulting cloth was inserted into a chemical vapor infiltration oven to form a thin deposit of pyrolytic carbon on the fibers, the deposit having a thickness of about 0.5 $\mu$m. A conventional gas was used containing methane as the carbon precursor.

The resulting cloth remained flexible and was cut using a water jet so as to obtain a shape similar to that shown in FIG. 2.

The shapable buffer ply that resulted therefrom was placed between the bottom of a bowl made of C/C composite material and a crucible.

After a silicon crystal-drawing cycle, and after the crucible and the residue of the buffer ply had been withdrawn, it could be seen that the bottom of the bowl presented very few traces of chemical attack or of mechanical stress.

What is claimed is:

1. A method of mounting a crucible in a bowl of carbon material, wherein, prior to housing the crucible in the bowl, a consumable buffer ply constituted essentially by a non-rigid fabric of carbon fibers is applied over at least a central portion of a bottom inside face of the bowl in order to protect the bowl from both physical and chemical interactions with the crucible.

2. A method according to claim 1, wherein a buffer ply is used that is constituted essentially by a flexible fabric selected from: a woven cloth, a knit, a multidirectional sheet, and a thin felt.

3. A method according to claim 1, wherein, prior to being put into place in the bowl, the buffer ply is put into a shape at least close to the shape of said portion of the inside face of the bowl.

4. A method according to claim 1, wherein, prior to putting the ply into place in the bowl, a thin deposit of pyrolytic carbon is formed on the fibers of the fabric.

5. A method according to claim 4, wherein the thickness of the deposit of pyrolytic carbon does not exceed 4 $\mu$m.

6. A method according to claim 5, wherein the thickness of the deposit of pyrolytic carbon lies in the range 0.1 $\mu$m to 2 $\mu$m.

7. A method according to claim 1, wherein the buffer ply is precut so as to enable it to take up the shape of said portion of the inside face of the bowl.

8. A method according to claim 1, wherein a buffer ply is used comprising a deformable fabric capable of taking up the shape of said portion of the inside face of the bowl by the fabric deforming without forming creases.

9. A method according to claim 1, wherein the buffer ply is subjected to heat treatment for purification purposes.

10. A method according to claim 1, wherein the buffer ply also covers at least part of a connecting portion of the inside face of the bowl between the bottom and a sidewall of the bowl.

11. A metallurgical installation comprising a bowl of carbon material, a crucible housed in the bowl, and a protective lining for protecting the bowl interposed between at least a central portion of a bottom inside face of the bowl and the crucible, wherein the protective lining is formed by a consumable, non-rigid buffer ply essentially constituted by a carbon fiber fabric.

12. An installation according to claim 11, wherein the buffer ply is essentially constituted by a fabric selected from: a woven cloth, a knit, a multidirectional sheet, and a thin felt.

13. An installation according to claim 11, wherein the thickness of the buffer ply does not exceed 4 mm.

14. An installation according to claim 11, wherein the buffer ply includes a thin deposit of pyrolytic carbon on the fibers of the fabric.

15. An installation according to claim 14, wherein the thickness of the deposit of pyrolytic carbon does not exceed 4 $\mu$m.

16. An installation according to claim 15, wherein the thickness of the deposit of pyrolytic carbon lies in the range 0.1 $\mu$m to 2 $\mu$m.

17. An installation according to claim 11, wherein the bowl is made of carbon/carbon composite material.

18. An installation according to claim 11, for drawing silicon crystals, wherein the buffer ply is disposed between at least a portion of the inside face of the bowl and a silica crucible for receiving silicon.

19. An installation according to claim 11, wherein the buffer ply also covers at least part of a connecting portion of the inside face of the bowl between the bottom and a sidewall of the bowl.

20. A method of mounting a crucible in a bowl made from a carbon material comprising:

disposing a consumable buffer ply over at least a portion of an interior face of the bowl, the buffer ply comprising a non-rigid carbon fiber fabric; and mounting the crucible in the bowl such that the crucible is substantially separated from an interior surface of the bowl by the consumable buffer ply.

21. An assembly comprising:

a support bowl made from a carbon material;

a crucible housed in said bowl; and a lining comprising a consumable non-rigid carbon fiber fabric interposed between an interior face of said support bowl and said crucible so as to substantially separate said interior face and said crucible.

* * * * *